United States Patent [19]
Melzner

[11] Patent Number: 5,315,542
[45] Date of Patent: May 24, 1994

[54] BIT LINE ARRANGEMENT FOR INTEGRATED CIRCUITS

[75] Inventor: Hanno Melzner, Feldkirchen-Westerham, Fed. Rep. of Germany

[73] Assignee: Siemens Aktiengesellschaft, Munich, Fed. Rep. of Germany

[21] Appl. No.: 984,376

[22] Filed: Dec. 2, 1992

[30] Foreign Application Priority Data

Dec. 2, 1991 [DE] Fed. Rep. of Germany ....... 4139719

[51] Int. Cl.$^5$ .............................................. G11C 5/06
[52] U.S. Cl. ......................................... 365/72; 365/63
[58] Field of Search ............................. 365/72, 63, 51

[56] References Cited

U.S. PATENT DOCUMENTS

| | | | |
|---|---|---|---|
| 5,021,998 | 6/1991 | Suzuki | 365/51 |
| 5,107,459 | 4/1992 | Chu | 365/72 |

FOREIGN PATENT DOCUMENTS

| | | |
|---|---|---|
| 0399531 | 11/1990 | European Pat. Off. . |
| 0428247 | 5/1991 | European Pat. Off. . |
| 3538053 | 5/1986 | Fed. Rep. of Germany . |

Primary Examiner—Eugene R. LaRoche
Assistant Examiner—A. Zarabian
Attorney, Agent, or Firm—Hill, Steadman & Simpson

[57] ABSTRACT

The arrangement relates to bit lines which are widened to form contact surfaces (11, 21, 31, 41, 51) at the contacts (10, 20, 30, 40, 50) to underlying cells, the contacts being arranged in an at least a three-fold stagger. A minimum space requirement is achieved in conjunction with increased reliability when the distance $b_{Sp}$ between edges of adjacent bit lines has the same value everywhere, and the contact surfaces can thereby be enlarged.

15 Claims, 3 Drawing Sheets

BIT LINE ARRANGEMENT FOR INTEGRATED CIRCUITS

BACKGROUND OF THE INVENTION

The present invention relates to a bit line arrangement for integrated circuits.

In integrated circuits, in particular DRAM semiconductor memories, the (memory) cells are contacted by means of bit lines, one bit line enabling access to a row of cells. The prescribed arrangement of the cells therefore determines the arrangement of these contacts. In this case, either each cell has its own contact to the overlying bit line, or two adjacent cells are connected to the bit line via one contact. Correspondingly, the distance between two successive contacts of the same bit line is one or two cell lengths. Both for production engineering reasons and for electrical reasons, it is generally necessary to widen the bit line to form a contact surface in the environment of the contacts, while at the same time trying to achieve a minimum space requirement.

FIG. 1 diagrammatically depicts a bit line arrangement corresponding to the prior art. The bit lines 1, 2, 3, 4, 5 extend in a first direction, which is defined by the rectilinear connection between contacts of the same bit line, over (represented only for the bit line 5) cells 52, and have contacts 10, 20, 30, 40, 50 via which they are each connected to one or two of the cells. The bit lines are widened to form contact surfaces 11, 21, 31, 41, 51 in an area of the contacts, in order to ensure adequate electrical contact even in the case of misadjustment of the bit lines with respect to the contacts (which are generally realized by contact holes in an underlying insulating layer). For process engineering reasons, in particular, (resolution in the phototechnical patterning of the bit lines), the distances between adjacent bit lines or their edges cannot be less than a specific minimum value $b_{sp}$. The minimum distance is between a contact surface and the adjacent bit line edge (see FIG. 1; the contacts are arranged in this case in a 4-fold stagger that is the contacts of adjacent bit lines are shifted by ¼ pitch. In a 3-fold stagger the contacts of adjacent bit lines are shifted by ⅓ pitch). In such a conventional arrangement, it is not possible, given a prescribed minimum distance $b_{sp}$, to further reduce the space requirement without reducing the contact surface or the width $b_B$ of the bit line outside the contact surface which results in lower reliability.

SUMMARY OF THE INVENTION

It is an object of the present invention to provide a bit line arrangement which has a higher, or at least equally high, reliability in conjunction with the same or a reduced space requirement.

This object is achieved when the distance between the edges of two adjacent bit lines is everywhere the same (within the range of manufacturing tolerances). That is, the minimum distance $b_{sp}$ occurs not only between the contact surface and adjacent bit line edge, but also between bit line edges outside the contact surfaces. As a result, it is possible either for the contact surface to be enlarged or for a gain in space to be achieved with a contact surface of the same size. In the case of an enlargement of the contact surface, not only does the maximum permissible misadjustment of the bit lines with respect to the above-mentioned contact holes become larger, but the current path around the contact hole also becomes wider. The layer thickness of the bit line material is usually small in the contact hole, with the result that a wide overlap is helpful in order to achieve low bit line resistances.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
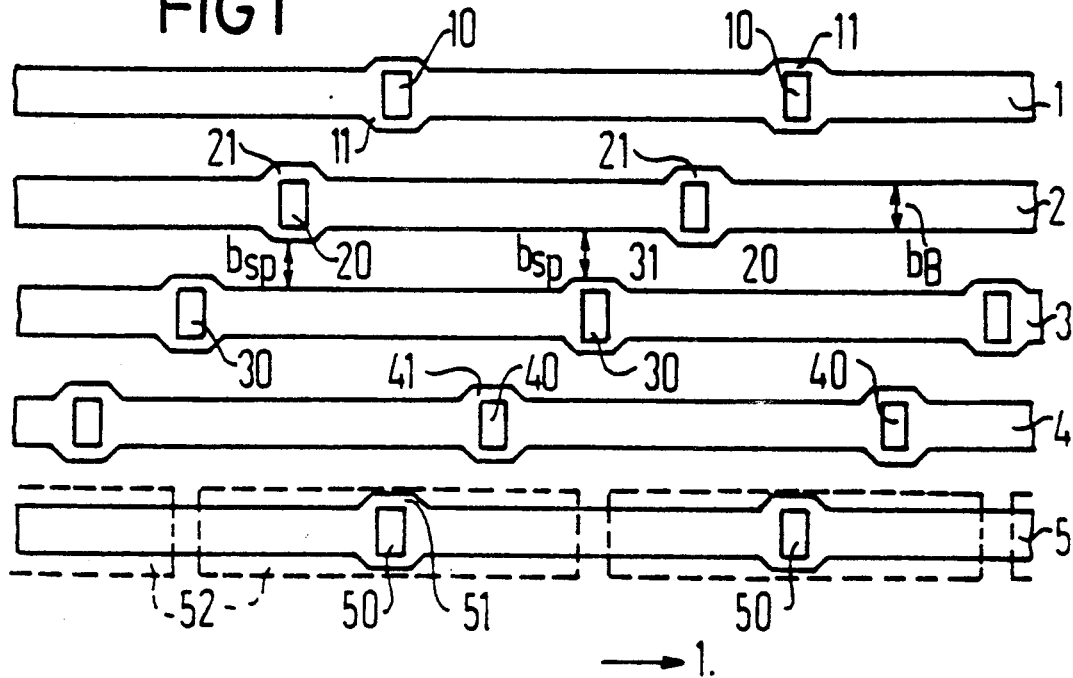
FIG. 1 shows a section of a bit line arrangement corresponding to the prior art.
Figure 2:
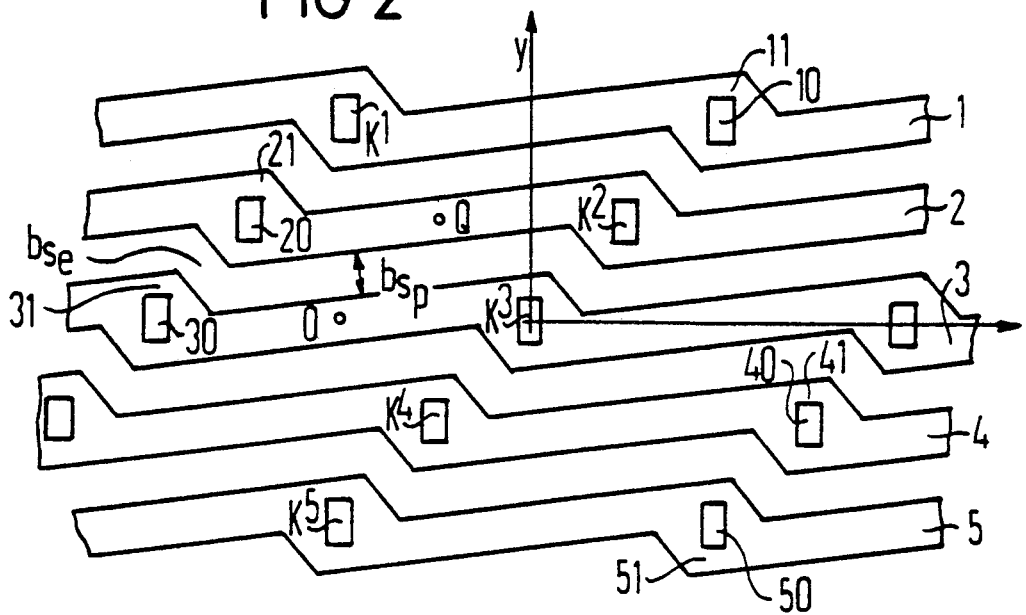
FIGS. 2 and 4 respectively show a section of two embodiments of the bit line arrangement according to the present invention.

The FIG. 2 geometrical arrangement of the contacts 10, 20, 30, 40, 50 corresponds to that in FIG. 1 and is, for example, prescribed by the underlying cell arrangement; the contacts having the same size as in FIG. 1. According to the present invention, the distance between the edges of adjacent bit lines is the same size everywhere, in particular being equal to the minimum distance $b_{sp}$, even in the region outside the contact surfaces 11, 21, 31, 41, 51. In this embodiment, the edges of the bit lines 1 to 5 are formed in segments of straight lines which do not extend parallel to a first direction. Straight lines occur in this arrangement with precisely two different gradients.

For the purpose of further explanation, which also includes the following figures, a coordinate system is used with an x-axis parallel to the first direction, a y-axis perpendicular to the first direction and an origin at the mid-point of the contact $K^3$ of the bit line 3, as depicted in FIG. 2. Furthermore, the following definitions are adopted:

| | |
|---|---|
| $b_B$, | Width of a bit line path, that is a bit line outside the contact surface; |
| $b_{Sp}$, | Distance between the edges of adjacent bit lines; |
| $R_{BL}$, | Bit line raster in the y-direction; |
| $R_{St}$, | Stagger raster which is equal to the offset of the contacts of adjacent bit lines in the x-direction; |
| n, | Stagger; n = 4 in the exemplary embodiments; |
| $K^1$-$K^5$, | Denotes the n + 1 contacts specified in the drawing; and |
| $L^i a$-$L^i d$, | Denotes the corner points of the contacts $K^i$, i = 1, ... |

-continued $$n + 1.$$

Figure 3:
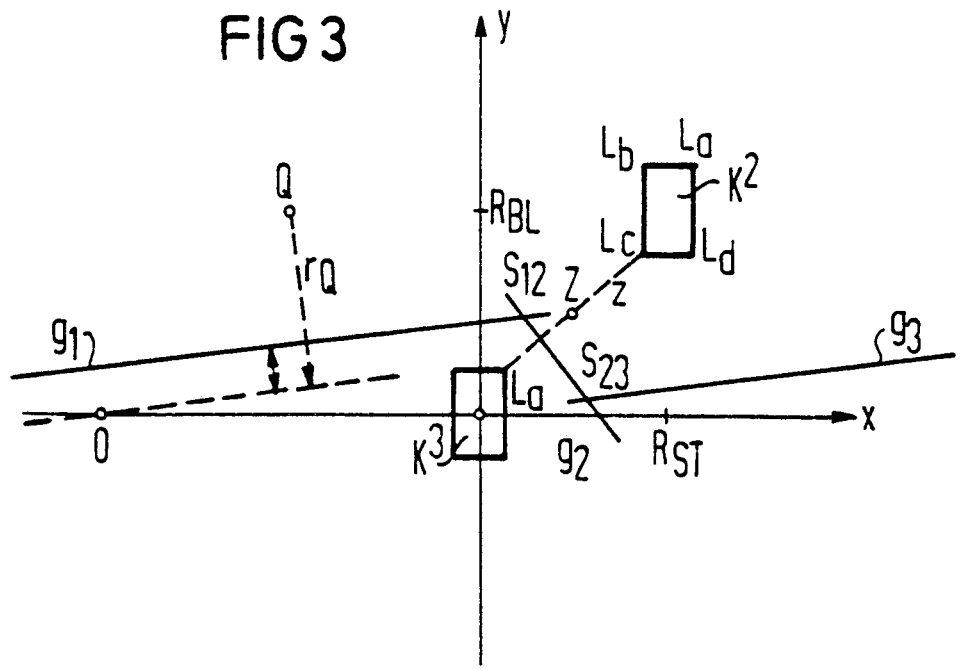
FIGS. 3 and 5 are graphs depicting in an enlarged representation the design principle for the exemplary embodiments.

As shown in FIG. 3 the design of the bit line arrangement of FIG. 2 is produced with the aid of three straight lines $g_1$, $g_2$, $g_3$, which represent the bit line edges in segments. The construction of these straight lines is explained below in the example of the bit line 3 and the contacts $K^3$, $K^2$ (see also FIG. 2):

$g_1$ mid-point O of the connecting section between $K^3$ and the contact, adjacent in the negative x-direction, of the bit line 3; O has the coordinates ($-2 R_{St}$; 0).

mid-point Q of the connecting section between $K^2$ and the contact, adjacent in the negative x-direction, of the bit line 2; Q ($-R_{St}$; $R_{BL}$).

circle $k_Q$ around Q of radius $r_Q = b_B + b_{Sp}$.

tangent to the circle $k_Q$ through O; this tangent is the path axis (center line) of the bit line section being sought.

$g_1$ is the parallel to the path axis at the distance $\frac{1}{2} b_B$.

$g_2$ the connecting section z between $L_a{}^3$ and $L_c{}^2$ with mid-point Z.

$g_2$ is perpendicular to z at the distance $\frac{1}{2} b_{Sp}$ from Z.

$g_3$ $g_3$ is produced by translation of $g_1$ in the positive x-direction by $4R_{St}$.

As may be gathered from the figure, the straight lines intersect at the points $S_{12}$ and $S_{23}$, and form one edge of the bit line 3 in the corresponding sections. The other edge and the edges of the remaining bit lines, in common with their extensions in the +x-direction (positive x-direction) and $-$x-direction (negative x-direction), are obtained in a simple manner by point reflection at the origin and translations from these straight lines.

It is easy to generalize to an n-fold stagger. For example, the coordinates of the mid-point are ($-n/2 R_{St}$; 0).

O is simultaneously the mid-point of $K^1$ and $K^{n+1}$ if n is even.

$g_3$ is obtained by a translation by $nR_{St}$.

$g_2$ is constructed as described.

Figure 4:
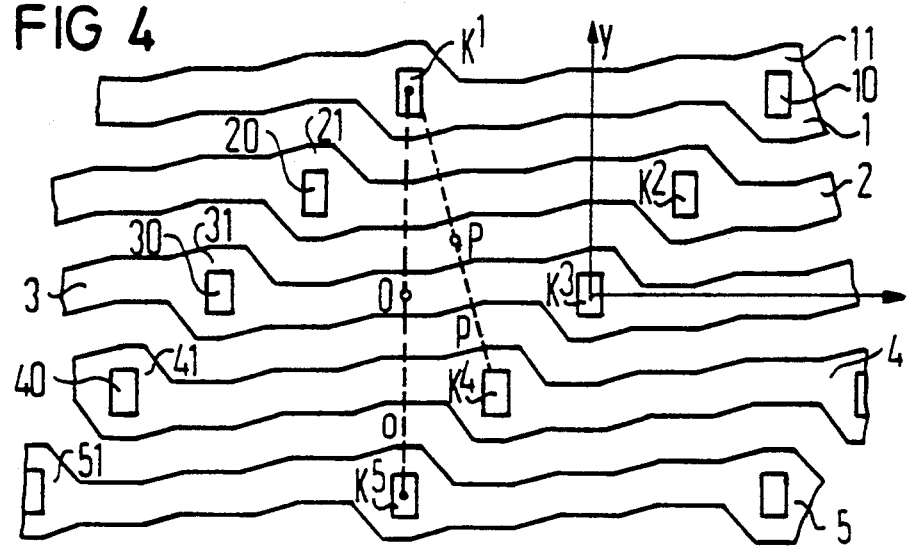
Figure 5:
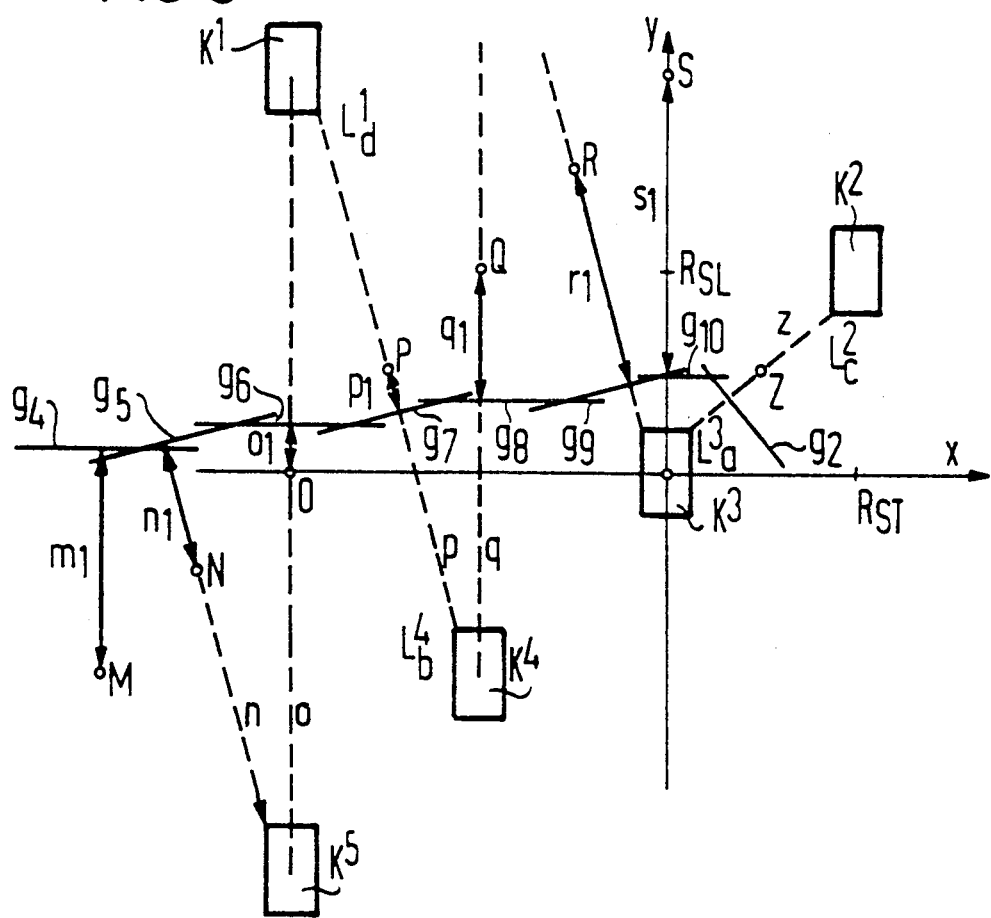

In the embodiment in accordance with FIG. 4, the straight line $g_1$, (and correspondingly $g_3$), which describes a part of the bit line edge, is replaced by a set of connected lines composed of four horizontal (that is to say extending in the x-direction) straight lines $g_4$, $g_5$, $g_8$, $g_{10}$ and three sloping straight lines $g_5$, $g_7$, $g_9$ situated therebetween and having a gradient differing from 0 (see also FIG. 5). In this case, the straight lines $g_4$–$g_{10}$ are at right angles to connecting sections (m, n, s) which connect a contact of a bit line either to the adjacent contact of the (n+1)th bit line at their mid-points or to the adjacent contact of the nth bit line at their corner points facing one another. Although the design of this arrangement is somewhat more complicated, the advantage, however, resides in a larger overlap of the contact surface at the corner of the contact, with the result that a larger misadjustment in this direction can be tolerated.

The FIG. 5 arrangement can be constructed, for example, in the following way (in the example of the upper edge of the bit line 3, see also FIG. 4):

$g_2$ like $g_2$ of the first exemplary embodiment;

$g_6$ connecting section 0 between $K^1$ and $K^5$ having mid-point 0 (0 can also be constructed as mid-point between $K^3$ and the contact, adjacent in the $-$x-direction, of the bit line 3; end points of the section 0 respectively mid-point of the contacts).

$g_6$ is the perpendicular to 0 (that is, gradient$=0$) at the distance $0_1 = \frac{1}{2} b_B$ from 0. It is possible to construct simultaneously with $g_6$ the corresponding sections of the edges of the other bit lines, which likewise have the gradient 0 between $K^1$ and $K^5$ (that is, in the area of $x = -2 R_{St}$) and are arranged in each case at distances of $b_{Sp}$ and $b_B$, respectively, from one another.

$g_7$ connecting section p between $L_d{}^1$ and $L_b{}^4$ having mid-point P.

$g_7$ is the perpendicular to p at the distance $\frac{1}{2} b_{Sp}$.

It is possible to construct simultaneously with $g_7$ the corresponding sections of the edges of the other bit lines, which are likewise perpendicular to p between $L_d{}^1$ and $L_b{}^1$ and are respectively arranged at the distance of $b_B$ and $b_{Sp}$, respectively, from one another.

$g_4$, $g_8$ and $g_{10}$, are constructed in a manner analogous to $g_6$ with the aid of the mid-points M, Q and S (the corresponding contacts are partly outside the section represented in FIG. 4). As may be seen from FIG. 4, the distances $m_1$, $q_1$, $s_1$ of the straight lines from these mid-points are:

$$m_1 = 1.5b_B + b_{Sp}$$

$$q_1 = \tfrac{1}{2}b_B + b_{Sp}$$

$$s_1 = 1.5b_B + 2b_{Sp}$$

$g_5$ and $g_9$, are constructed in a manner analogous to $g_7$ with the aid of the mid-points N and R of the sections n and r (which are not completely represented). The distances $n_1$, $r_1$ of the straight lines from these mid-points are:

$$n_1 = b_B + \tfrac{1}{2}b_{Sp}$$

$$r_1 = b_B + 1.5b_{Sp}.$$

The gradient of the sections n, p and r clearly depends in a defined way on $R_{BL}$, $R_{St}$ and the dimensions of the contacts, from which it is possible analytically to calculate the gradient of the straight lines $g_5$, $g_7$, $g_9$, respectively perpendicular to n, p, r.

In the two embodiments, the straight lines $g_j$, $j = 1, \ldots, 10$, and their points of intersection $S_{jk}$, and thus the precise course of the bit line edges can be calculated mathematically with the aid of the rectilinear equations $g_j = a_{jx} + b_j$. This is outlined briefly below with the aid of the first exemplary embodiment (see FIG. 3 and FIG. 6):

A) Calculation of the straight lines $g_1$, $g_2$, $g_3$

Figure 6:
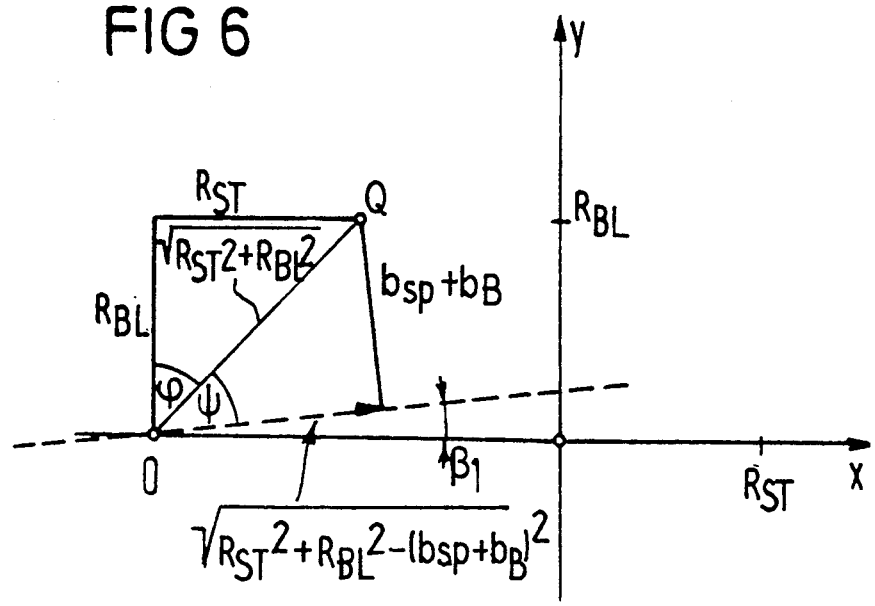
FIG. 6 is a graph depicting a sketch for calculating the straight lines describing the bit line edges.

By using the auxiliary angles $\phi$, $\psi$ specified in FIG. 6, it follows for the angle $\beta_1$ and thus for the gradient $a_1$ of the straight line $g_1$ that:

$$\beta_1 = 90° - \phi - \psi$$

$$a_1 = \tan \beta_1 = (\cot \phi \cot \psi - 1)/(\cot \phi + \cot \psi)$$

$$\cot \phi = R_{BL}/R_{St}$$

$$\cot \psi = \mathrm{sqr}(R_{St}^2 + R_{BL}^2 - (b_B + b_{Sp})^2)/(b_B + b_{Sp})$$

$$a_1 = (R_{BL}\mathrm{sqr}(R_{BL}^2 + R_{St}^2 - (b_B + b_{Sp})^2) - R_{St}(b_B + b_{Sp}))/(R_{St}\mathrm{sqr}(R_{BL}^2 + R_{St}^2 - (b_B + b_{Sp})^2) - R_{BL}(b_B + b_{Sp}))$$

The axial section $b_1$ of the straight line $g_1$ is found from the condition that $g_1$ has a distance of $b_B/2$ from 0, that is, it passes through the point $$(-2R_{St} - b_B/2 \sin \beta_1; b_B/2 \cos \beta_1)$$

or $$(-2R_{St} - b_B a_1/(2\mathrm{sqr}(1+a_1^2)); b_B/(2\mathrm{sqr}(1+a_1^2)))$$

that is, $$b_1 = b_B/(2\mathrm{sqr}(1+a_1^2)) + 2a_1 R_{St} + b_B a_1^2/(2\mathrm{sqr}(1+a_1^2)).$$

The straight line $g_3$ is produced from $g_1$ by translation by $4R_{St}$ in the x-direction. The characteristics of $g_3$:$Y = a_3 x + b_3$ thus become $$a_3 = a_1$$

$$b_3 = b_1 - rR_{St} a_1$$

For $$g_2: Y = a_2 x + b_2,$$

$$a_2 = -(R_{St} - x_{KL})/(R_{BL} - y_{KL})$$

$x_{KL}$ being the dimension of the contact hole in the x-direction, and
$y_{KL}$ that in the y-direction.
$g_2$ passes through the point.

$$(R_{St}/2 + b_{Sp}/2 \sin \beta_2; R_{BL}/2 - b_{Sp}/2 \cos \beta_2)$$

or $$(R_{St}/2 + b_{Sp} a_2/(2\mathrm{sqr}(1+a_2^2); R_{BL}/2 - b_{Sp}/(2\mathrm{sqr}(1+a_2^2)))$$

(where $\beta_2$ is the angle of slope of $g_2$). Consequently, $$b_2 = R_{BL}/2 - b_{Sp}/(2\mathrm{sqr}(1+a_2^2)) - R_{St} a_2/2 - b_{Sp} a_2^2/(2\mathrm{sqr}(1+a_2^2)).$$

B) Calculation of the points of intersection $S_{12}$ and $S_{23}$:

$S_{12}$: $(-(b_2-b_1)/(a_2-a_1), -a_2(b_2-b_1)/(a_2-a_1)+b_2)$ and
$S_{23}$: $(-(b_3-b_2)/(a_3-a_2), -a_3(b_3-b_2)/(a_3-a_2)+b_3)$.

The straight lines $g_4$–$g_{10}$ of the second exemplary embodiment can be calculated using analogous considerations. As already explained, it has the advantage that the overlap at the corners of the contact is somewhat greater. The overlap at the corner is $L_a$: $0.5\mathrm{sqr}((R_{St} - x_{KL})^2 + (R_{BL} - y_{KL})^2) - b_{Sp}$,
$L_d$: $0.5\mathrm{sqr}((R_{St} - x_{KL})^2 + (3R_{BL} - y_{KL})^2) - 2b_b - 3b_{Sp}$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A bit line arrangement for integrated circuits, comprising:
   a plurality of bit lines;
   each bit line of the plurality of bit lines having at least one contact that contacts at least one underlying conductive region and being widened to form a contact surface only in an area of said contact;
   contacts of adjacent bit lines being offset relative to one another thereby forming at least a 3-fold stagger; and
   a distance between bit line edges of two adjacent bit lines having everywhere a substantially constant value within a range of manufacturing tolerances.

2. The bit line arrangement according to claim 1, wherein the integrated circuit has a plurality of cells at least one of which has said at least one conductive region and wherein each bit line of the plurality of bit lines has a plurality of contacts succeeding one another in a row in a first direction, a respective contact of the plurality of contacts of each bit line contacting a respective underlying conductive region of at least one cell of the plurality of cells.

3. The bit line arrangement according to claim 2, wherein given a prescribed geometrical arrangement and size of the contacts of each of the bit lines of the plurality of bit lines, bit line edges of a given bit line of the plurality of bit lines represent, in segments, straight lines which have two gradients which differ at least in sign and differ from zero with respect to the first direction.

4. The bit line arrangement according to claim 3, wherein the straight lines are three straight lines $g_1$, $g_2$, $g_3$ that satisfy the following rule of construction:
   $g_1$:
      mid-point 0 of a connecting section between contact $K^i$ and a contact, adjacent in the negative x-direction, of the $i^{th}$ bit line; the mid-point having coordinates, $-2$ $R_{St}$; 0;
      mid-point Q of a connecting section between contact $K^{i-1}$ and a contact, adjacent in the positive x-direction, of an adjacent $i-1$ bit line; mid-point Q having coordinates $-R_{St}$, $R_{BL}$;
      circle $K_Q$ around mid-point Q of radius $r_Q = b_B + b_{Sp}$;
      tangent to the circle $k_Q$ through mid-point 0; this tangent being a path axis of a bit line section being sought;
      $g_1$ being parallel to the path axis at a distance $\frac{1}{2}$ $b_S$;
   $g_2$:

connecting section z between $L_a{}^i$ and $L_c{}^{i-1}$ with mid-point Z;

$g_2$ being perpendicular to connecting section z at a distance $\frac{1}{2} b_{SP}$ from mid-point Z;

$g_3$:

$g_3$ being produced by translation of $g_1$ in the positive x-direction by $4R_{St}$;

where:

$b_B$: is the width of a bit line outside a contact surface;

$b_{Sp}$: is the distance between edges of adjacent bit lines;

$R_{BL}$: is a bit line raster in the y-direction;

$R_{St}$: is a stagger raster which is equal to the offset of the contacts of adjacent bit lines in the x-direction;

n: is a whole number for an n-fold stagger of n+1 bit lines;

$K^i$: denotes the i=1 ... n+1 contacts of the n+1 bit lines; and $L_a{}^i - L_d{}^i$: denotes corner points of the contacts $K^i$, i=1, .. n+1.

5. The bit line arrangement according to claim 4, wherein the straight lines $g_1$, $g_2$, $g_3$ satisfy the following conditions:

$g_j = a_j + b_j$
$j = 1, 2, 3$ where $$a_1 = (R_{BL}\text{sqr}(R_{BL}{}^2 + R_{St}{}^2 - (b_B + b_{Sp})^2) - R_{St}(b_B + b_{Sp}))/(R_{St}\text{sqr}(R_{BL}{}^2 + R_{St}{}^2 - (b_B + b_{Sp})^2) - R_{BL}(b_B + b_{Sp}))$$

$$b_1 = b_B/(2\text{sqr}(1 + a_1{}^2)) + 2a_1 R_{St} + b_b a_1{}^2/(2\text{sqr}(-1 + a_1{}^2))$$

$$a_2 = -(R_{St} - x_{KL})/(R_{BL} - y_{KL})$$

$$b_2 = R_{BL}/2 - b_{Sp}/(2\text{sqr}(1 + a_2{}^2)) - R_{St}a_2/2 - b_{Sp}a_2{}^2/2\text{sqr}(1 + a_2{}^2))$$

$$a_3 = a_1$$

$$b_3 = b_1 - 4R_{St}a_1.$$

6. The bit line arrangement according to claim 2, wherein given a prescribed geometrical arrangement and size of the contacts, the bit line edges represent, in segments, straight lines which have at least three different gradients.

7. The bit line arrangement according to claim 6, wherein the straight lines are at right angles to connecting sections, the connecting sections connecting either a contact of one bit line to an adjacent contact of a neighboring bit line at their mid-points or connecting a contact of one bit line to an adjacent contact of a neighboring bit line at adjacent corner points thereof.

8. A bit line arrangement for integrated circuits, comprising:

a plurality of bit lines and a plurality of cells;

each bit line of the plurality of bit lines having a row of contacts in a first direction, each contact thereof contacting a conductive region of a respective cell and being widened to form a contact surface only in an area of said contacts;

contacts of adjacent bit lines being offset relative to one another thereby forming at least a 3-fold stagger;

a distance between bit line edges of two adjacent bit lines having everywhere a substantially constant value within a range of manufacturing tolerances;

given a prescribed geometrical arrangement and size of the contacts, bit line edges of a given bit line of the plurality of bit lines represent, in segments, straight lines which have two gradients which differ at least in sign and differ from 0 with respect to the first direction, the straight lines being three straight lines $g_1$, $g_2$, $g_3$ that satisfy the following rule of construction:

$g_1$:

mid-point 0 of a connecting section between contact $K^i$ and a contact, adjacent in the negative x-direction, of the $i^{th}$ bit line; the mid-point having coordinates, $-2 R_{St}$; 0;

mid-point Q of a connecting section between contact $K^{i-1}$ and a contact, adjacent in the positive x-direction, of an adjacent i−1 bit line; mid-point Q having coordinates $-R_{St}$, $R_{BL}$;

circle $K_Q$ around mid-point Q of radius $r_Q = b_B + b_{Sp}$;

tangent to the circle $k_Q$ through mid-point 0; this tangent being a path axis of a bit line section being sought;

$g_1$ being parallel to the path axis at a distance $\frac{1}{2} b_S$;

$g_2$:

connecting section z between $L_a{}^i$ and $L_c{}^{i-1}$ with mid-point Z;

$g_2$ being perpendicular to connecting section z at a distance $\frac{1}{2} b_{SP}$ from mid-point Z;

$g_3$:

$g_3$ being produced by translation of $g_1$ in the positive x-direction by $4R_{St}$;

where:

$b_B$: is the width of a bit line outside a contact surface;

$b_{Sp}$: is the distance between edges of adjacent bit lines;

$R_{BL}$: is a bit line raster in the y-direction;

$R_{St}$: is a stagger raster which is equal to the offset of the contacts of adjacent bit lines in the x-direction;

n: is a whole number for an n-fold stagger of n+1 bit lines;

$K^i$: denotes the i=1 ... n+1 contacts of the n+1 bit lines; and $L_a{}^i - L_d{}^i$: denotes corner points of the contacts $K^i$, i=1, .. n+1.

9. The bit line arrangement according to claim 8, wherein the straight lines $g_1$, $g_2$, $g_3$ satisfy the following conditions:

$g_j = a_j + b_j$
$j = 1, 2, 3$ where $$a_1 = (R_{BL}\text{sqr}(R_{BL}{}^2 + R_{St}{}^2 - (b_B + b_{Sp})^2) - R_{St}(b_B + b_{Sp}))/(R_{St}\text{sqr}(R_{BL}{}^2 + R_{St}{}^2 - (b_B + b_{Sp})^2) - R_{BL}(b_B + b_{Sp}))$$

$$b_1 = b_B/(2\text{sqr}(1 + a_1{}^2)) + 2a_1 R_{St} + b_b a_1{}^2/(2\text{sqr}(-1 + a_1{}^2))$$

$$a_2 = -(R_{St} - x_{KL})/(R_{BL} - y_{KL})$$

$b_2 = R_{BL}/2 - b_{Sp}/(2\text{sqr}(1+a_2^2)) - R_{St}a_2/2 - b_{Sp}a_2^2/(2\text{sqr}(1+a_2^2))$ $a_3 = a_1$ $b_3 = b_1 - 4R_{St}a_1$.

10. A bit line arrangement for integrated circuits, comprising:
a plurality of bit lines and a plurality of cells;
each bit line of the plurality of bit lines having a row of contacts in a first direction, each contact thereof contacting a conductive region of a respective cell and being widened to form a contact surface only in an area of said contacts;
contacts of adjacent bit lines being offset relative to one another thereby forming at least a 3-fold stagger;
a distance between bit line edges of two adjacent bit lines having everywhere a substantially constant value within a range of manufacturing tolerances; and
given a prescribed geometrical arrangement and size of the contacts, the bit line edges represent, in segments, straight lines which have at least three different gradients.

11. The bit line arrangement according to claim 6, wherein the straight lines are at right angles to connecting sections, the connecting sections connecting either a contact of one bit line to an adjacent contact of a neighboring bit line at their mid-points or connecting a contact of one bit line to an adjacent contact of a neighboring bit line at adjacent corner points thereof.

12. The bit line arrangement according to claim 6, wherein for each of the straight lines, a respective straight line is perpendicular to a connecting section between respective first and second contacts of first and second bit lines, respectively, the respective connecting section connecting a predetermined location of said first contact to a predetermined location of said second contact.

13. The bit line arrangement according to claim 12, wherein said predetermined locations of said first and second contacts are mid-points of said first and second contacts.

14. The bit line arrangement according to claim 12, wherein each of said first and second contacts have corners and wherein said predetermined locations of said first and second contacts comprise a corner of said first contact that is the closest to a corner of said second contact.

15. The bit line arrangement according to claim 12, wherein said contacts are contact holes in an insulating layer.

* * * * *